United States Patent [19]
Golke et al.

[11] Patent Number: 4,837,520
[45] Date of Patent: Jun. 6, 1989

[54] FUSE STATUS DETECTION CIRCUIT

[75] Inventors: Keith W. Golke, Minneapolis; Robert L. Rabe, Maple Grove, both of Minn.

[73] Assignee: Honeywell Inc., Minneapolis, Minn.

[21] Appl. No.: 129,891

[22] Filed: Nov. 12, 1987

Related U.S. Application Data

[63] Continuation-in-part of Ser. No. 717,935, Mar. 29, 1985.

[51] Int. Cl.⁴ .................. G08B 21/00; G01R 31/02
[52] U.S. Cl. .................. 324/550; 340/638; 365/200; 307/219; 307/441
[58] Field of Search ............ 357/51; 365/200, 227; 307/441, 304, 219, 279; 324/550; 340/638

[56] References Cited

U.S. PATENT DOCUMENTS

| | | |
|---|---|---|
| 3,872,450 | 3/1975 | Reynolds . |
| 4,158,147 | 6/1979 | Edwards . |
| 4,346,459 | 8/1982 | Sud et al. . |
| 4,417,154 | 11/1983 | Kuo . |
| 4,446,534 | 5/1984 | Smith . |
| 4,532,607 | 7/1985 | Uchida ............... 307/202.1 |
| 4,546,455 | 10/1985 | Iwahashi ............. 307/202.1 |
| 4,590,388 | 5/1986 | Clemons ............. 307/202.1 |
| 4,613,959 | 9/1986 | Jiang ................. 365/200 |

FOREIGN PATENT DOCUMENTS 2230753 1/1974 Fed. Rep. of Germany ...... 340/638

OTHER PUBLICATIONS

Yoshida, Masanobu et al., "A 288K CMOS EPROM With Redundancy", *IEEE Journal of Solid-State Circuits*, vol. SC-18, No. 5, Oct. 1983, pp. 544–550.

Primary Examiner—Reinhard J. Eisenzopf
Assistant Examiner—Jose M. Solis
Attorney, Agent, or Firm—W. T. Udseth

[57] ABSTRACT

A fuse status detection circuit for determining the conduction of fuses used in integrated circuits is disclosed based on a flip-flop circuit containing the fuses which is set to an initial state during operation.

21 Claims, 1 Drawing Sheet

FUSE STATUS DETECTION CIRCUIT

BACKGROUND OF THE INVENTION

The Government has rights in this invention pursuant to Contract No. DNA001-83-C-0241 awarded by the Defense Nuclear Agency.

This application is a continuation-in-part of application Ser. No. 717,935, filed Mar. 29, 1985.

The present invention relates to the field of programmable fuse circuitry. More particularly, it relates to a circuit for detection of the status of a fuse.

It is common in the manufacture of large-are integrated circuit devices for defects to occur. To increase the yield of a circuit, it is common to include redundant circuit elements with which to replace defective circuit elements. For example, in memory devices, additional columns or rows may be included on the chip. During circuit test, fuses may then be conditioned to replace defective memory cells with non-defective redundant elements.

Another use for fuse status detection circuitry is as an input to a logic function circuit. Based on the state of a programmed fuse, the logic circuit will perform a selected logic function.

Common integrated circuit fuses are of either the laser blown type, laser annealed type, or of the electrically blown type. Regardless of the type of fuse used, the circuit to be programmed must be capable of detecting the status of its fuses in order to perform its intended function. Most conventional fuse detection circuitry includes pull-up or pull-down circuits to eliminate internal floating nodes. These circuits tend to be complex, sometimes requiring additional processing steps. Some of these conventional circuits allow a steady-state current to flow depending on the fuse status, and therefore compromise minimal power requirement.

SUMMARY OF THE INVENTION

The present inventio provides a fuse status detection circuit for use in reconfigurable integrated circuits. In the preferred embodiment, the fuse structure is incorporated into the circuit to produce a flip-flop, and CMOS technology is used to achieve low power consumption. The fuse status is inherently detected when the circuit is powered up, and no clocking pulses are necessary. The circuit is functionally stable and independent of the fuse technology used. The circuit is also inherently insensitive to the effects to globally or locally ionizing radiation.

DESCRIPTION OF THE PREFERRED EMBODIMENT

Figure 1:
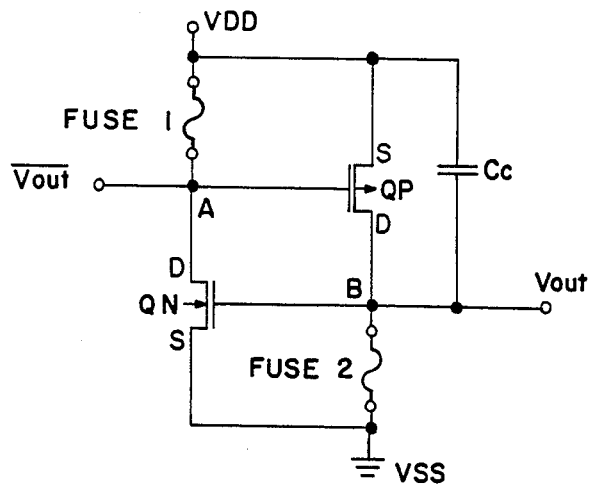
FIG. 1 shows a circuit schematic of a preferred embodiment of the present invention.

FIG. 1 is a detailed schematic diagram of a programmable fuse circuit in accordance with a preferred embodiment of the present invention. A positive voltage supply terminal, $V_{DD}$, is connected to one terminal of fuse 1, to the source S of a p channel transistor QP and to one terminal of an initializing element, shown as a capacitor $C_C$. The other terminal of fuse 1, node A, is connected to the drain D of a transistor QN and to the gate of QP. The drain D of QP, node B, is connected to the gate of QN and to the other terminal of the initializing element ($C_C$) and is also $V_{out}$. The source S of ON is connected to ground, $V_{SS}$. Fuse 2 is connected in parallel between the gate of QN and ground.

Figure 2:
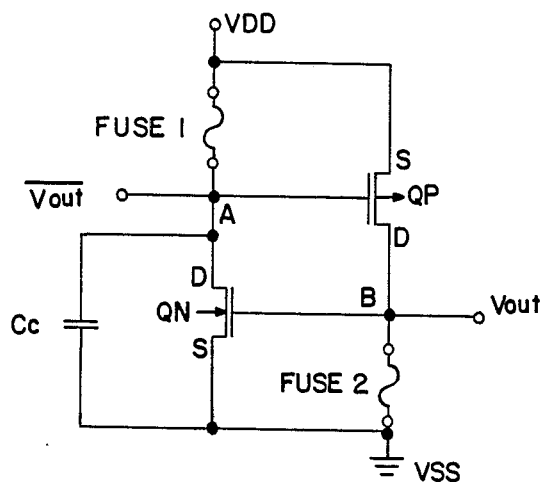
FIG. 2 shows a circuit schematic of an alternate embodiment of the present invention.
Figure 3:
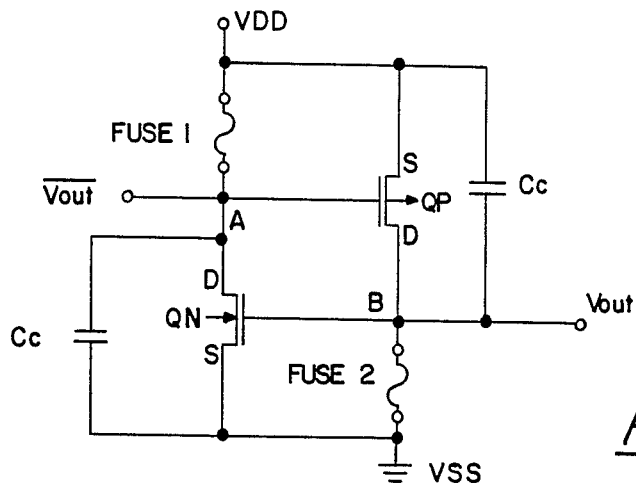
FIG. 3 shows a circuit schematic of a third embodiment of the present invention.

The purpose of the initializing element is to turn on the transistors during power up. By providing a current path between the gate of QN and the power supply, or between the gate of QP and ground during power up, the transistors will reach their turn-on threshold voltage. Once the transistors turn on, the circuit will achieve a stable state depending on the fuse status because of a positive feedback loop which will be discussed later. The initializing element can be a capacitor or other device, such as a transistor, which provides a current path during power up of the circuit. As shown in FIG. 2, the initializing element can be placed in parallel with QN instead of in parallel with QP as in FIG. 1. Alternately, two initializing elements can be used as shown in FIG. 3. The three circuit embodiments shown are substantially equivalent.

Proper fuse status detection requires proper functioning of the initializing element(s) (as discussed further below). Therefore it is strongly preferred to use capacitors Cc of the type which offer the most stability under various environments as the initializing element(s). The thin film capacitor offers stability over the junction capacitor in this regard for two reasons.

First, in an environment which can generate hole-electron pairs in, for example, silicon (e.g. due to radiation or heat), the resulting current across the p-n junction of a junction capacitor will reduce or even negate the net capacitance. This is not the case with the thin film capacitor since the thin film metal electrode is separated from the underlying doped semiconductor region by a dielectric layer. Second, the junction capacitor relies on a space charge or depletion region adjacent the junction to provide capacitance. The width of this depletion region is a function of the applied voltage and temperature. In contrast, the capacitance of the thin film capacitor is essentially independent of the applied voltage and the temperature.

The thin film capacitors can be trimmed to provide selected values of capacitance.

In the preferred embodiment of the present invention, QN and QP are MOS transistors typically implemented in a CMOS technology. The fuses may be strips of conductive polysilicon which can be blown by a laser. When blown, the fuses change from a conductive state to a nonconductive state. For porper operation of the preferred circuit, both fuses must have the same state; that is, either both conductive or both nonconductive.

In a normal mode of operation, terminal $V_{DD}$ is connected to a positive voltage supply of approximately 5 volts, and terminal $V_{SS}$ is connected to a ground potential. When fuses 1 and 2 are conductive, node A is connected to the power supply through fuse 1 and is thereby charged to a positive voltage, causing transistor QP to become less conductive. As transistor QP becomes less conductive, the voltage at node B decreases through the discharging action of fuse 2, causing transistor QN to become less conductive. Likewise, as QN becomes less conductive, node A increases in voltage causing QP to become still less conductive, and so on. This positive feedback loop results in both QP and QN being turned fully off, reducing the static power supply current to the level of parasitic junction leakage, and producing a node B and node A voltage out equal to the ground potential, and power supply potential, respectively.

For the case when the fuses are conductive, if the fuse conductance is made large in comparison to the conductance of QP and QN, the only stable state for the circuit is node A equal to the power supply voltage, and node B equal to the ground potential. For example, if polysilicon, having a sheet resistivity of 100 ohms per square is used as the fuse material, the designer can choose the resistance of the fuse by varying the number of squares such that the fuse conductance is greater than the maximum conductance of the transistors. If the fuse is 5 squares long, the total fuse resistance is 500 ohms. The transistors need to exhibit a resistance roughly 2 to 4 times greater than 500 ohms. The typical transistor would then have a width to length ratio of less than 10. The exact ratio is dependent on process conditions and must be chosen to fit particular fabrication methods.

In the opposite case when the fuses are non-conductive, as the circuit is powered up and $V_{DD}$ increases from zero volts, node B voltage increases due to the action of the initializing element (e.g., the capacitive coupling action of capacitor $C_C$ to the power supply $V_{DD}$). By configuring the initialization element to produce a node B voltage sufficient to cause QN to turn-on, node A discharges which turns QP on, thereby raising node B to $V_{DD}$ and completing the positive feedback loop. Both QP and QN will remain on with a drain current nearly equal to zero and node A and node B equal to the power supply potential and ground potential, respectively. Conversely, this same initialization could be performed by discharging node A, such that QP turns on. QP then charges node B, turning on QN and thereby completing the positive feedback loop.

A functional summary is given in Table 1.

TABLE 1

| Fuse 1 & Fuse 2 Status | $I_{DD}$ | $V_{out}$ | $\overline{V_{out}}$ |
|---|---|---|---|
| conductive | 0 | $V_{SS}$ | $V_{DD}$ |
| nonconductive | 0 | $V_{DD}$ | $V_{SS}$ |

The output signal is taken from the drain connection of either transistor. Either $V_{out}$ or $\overline{V_{out}}$ or both can be used to control redundant circuitry. Thus, the flip-flop or bistable fuse detection circuits shown in the Figures produce an output level of ether ground or $V_{DD}$, depending on the state of the fuses, without the need for clocking, refreshing, or d.c. power consumption. The disclosed circuits are stable and have a functionality that is independent of the fuse technology employed.

The circuits are also highly insensitive to upset by time dependent radiation phenomena, which produces charge that can be collected by circuit nodes. Due to the high conductivity of the fuses, a very large amount of radiation is required in order to significantly change the node voltages. When the fuses are nonconductive, the inherent circuit state is such that no semiconductor p-n junctions are reverse biased. Because the collection of charge due to radiation tends to reduce the reverse bias on a p-n junction, any charge collection resulting from a radiation phenomena merely reinforces the state of the circuit, and nodes A and B are therefore inherently stable. Thus, the circuits are inherently insensitive to transient ionizing radiation.

The embodiments of the invention in which an exclusive property or right is claimed are defined as follows:

1. A fuse state detection circuit for detecting the status of a fuse, the circuit comprising:
   first and second terminal means adapted for electrical connection to first and second voltage sources, respectively;
   a flip-flop circuit electrically connected between first and second terminal means comprising two fuses and further comprising two transistors each having a control region, each fuse being in a load circuit of one of the transistors with the control region of each transistor being electrically connected to the load circuit of the other transistor, each fuse providing a conductive path of a selected conductivity which is of a relatively high conductivity in the form in which the fuse is initially provided but of a relatively low conductivity if blown; and
   an initializing element electrically connected between a selected one of said first and second terminal means and a selected one of said transistor control region, wherein said initializing element includes a capacitor comprising a thin film metal layer which overlies and is separated from a doped semiconductor region by an insulating layer, and whereby, if the detection circuit is electrically energized, a first predetermined signal is provided if the fuses are conducting and a second predetermined signal is provided if the fuses are blown.

2. The apparatus of claim 1 wherein the fuse comprises a member of conductive polysilicon.

3. The apparatus of claim 2 wherein one of the transistors is a p channel MOS transistor and the other transistor is a n channel MOS transistor.

4. A fuse status detection circuit for detecting the status of a fuse, the circuit comprising:
   first and second terminal means adapted for electrical connection to first and second voltage sources, respectively;
   a flip-flop circuit electrically connected between first and second terminal means comprising two fuses and further comprising two transistors each having a control region, each fuse being in a load circuit of one of the transistors with the control region of each transistors being electrically connected to the load circuit of the other transistor, each fuse providing a conductive path of a selected conductivity which is of a relatively high conductivity in the form in which the fuse is initially provided but of a relatively low conductivity if blown; and
   an initializing transistor electrically connected between a selected one of said first and second terminal means and a selected one of said transistor control regions for selectively providing a current path therebetween, and whereby, if the detection circuit is electrically energized, a first predetermined signal is provided if the fuses are conducting and a second predetermined signal is provided if the fuses are blown.

5. A fuse status detection circuit, the circuit comprising:
   first and second terminal means adapted for electrical connection to first and second voltage sources, respectively;
   first and second transistors each having first and second terminating regions and a control region therein by which it is capable of being directed to effectively provide a conductive path of a selected conductivity between its said first and second terminating regions, the first transistor first terminating region being electrically connected to the second transistor control region, the first transistor second terminating region being electrically connected to the second terminal means, the second transistor first terminating region being electrically connected to the first terminal means, and the second transistor second terminating region being electrically connected to the first transistor control region; and an initializing transistor electrically connected between a selected one of the first and second terminal means and a selected one of the first and second transistor control regions for selectively providing a current path therebetween; and first and second fuses each having a first and second terminating region between which a conductive path of a selected conductivity is provided and being of a relatively high conductivity in the form in which it is initially provided but of a relatively low conductivity if blown, the first fuse being electrically connected between the first terminal means and the second transistor control region, and the second fuse being electrically connected between the first transistor control region and the second terminal means, whereby, if the detection circuit is electrically energized, a first predetermined signal is provided if the first and second fuses are both conducting, and a second predetermined signal is provided if the first and second fuses are blown.

6. The apparatus of claim 1 wherein one of the transistors is a p channel MOS transistor and the other transistor is a n channel MOS transistor.

7. A fuse detection circuit which comprises:
a first transistor having a drain, a gate and a source;
a second transistor having a drain, a gate and a source;
means for connecting the drain of the first transistor to the gate of the second transistor;
means for connecting the gate of the first transistor to the drain of the second transistor;
an initializing transistor;
means for connecting said initializing transistor between the drain and the source of at least one of said first or second transistors;
a pair of fuses;
means for connecting one of the fuses between the gate of the first transistor and the source of the first transistor;
means for connecting the second fuse between the gate of the second transistor and the source of the second transistor;
means for connecting a high positive voltage to the source of the first transistor;
means for connecting ground potential to the source of the second transistor;
output means connected to the drain of either transistor for providing an output signal; and
said first and second transistors, said initializing transistor and fuses having parameters selected so that, when the fuses are conductive, the output means provides a first predetermined output signal and so that, when the fuses are nonconductive, the output means provides a second predetermined output signal.

8. A fuse status detection circuit, the circuit comprising:

first and second terminal means adapted for electrical connection to first and second voltage sources, respectively;

first and second transistors each having first and second terminating regions and a control region therein by which it is capable of being directed to effectively provide a conductive path of a selected conductivity between its said first and second terminating regions, the first transistor first terminating region being electrically connected to the second transistor control region, the first transistor second terminating region being electrically connected to the second terminal means, the second transistor first terminating region being electrically connected to the first terminal means, and the second transistor second terminating region being electrically connected to the first transistor control region; and an initializing element electrically connected between a selected one of the first and second terminal means and a selected on of the first and second transistor control regions, wherein said initializing element includes a capacitor comprising a thin film metal layer which overlies and is separated from a doped semiconductor region by an insulating layer; and first and second fuses each having a first and second terminating region between which a conductive path of a selected conductivity is provided and being of a relatively high conductivity in the form in which it is initially provided but of a relatively low conductivity if blown, the first fuse being electrically connected between the first terminal means and the second transistor control region, and the second fuse being electrically connected between the first transistor control region and the second terminal means, whereby, if the detection circuit is electrically energized, a first predetermined signal is provided if the first and second fuses are both conducting, and a second predetermined signal is provided if the first and second fuses are blown.

9. The apparatus of claim 8 wherein the initializing element comprises a capacitor.

10. The apparatus of claim 8 wherein at least one of the fuses comprises a member of conductive polysilicon.

11. The apparatus of claim 8 wherein one of the transistors is a p channel MOS transistor and the other transistor is a n channel MOS transistor.

12. A fuse detection circuit which comprises:
a first transistor having a drain, a gate and a source;
a second transistor having a drain, a gate and a source;
means for connecting the drawin of the first transistor to the gate of the second transistor;
means for connecting the gate of the first transistor to the drain of the second transistor;
an initializing element including a capacitor, said capacitor comprising a thin film metal layer which overlies and is separated from a doped semiconductor region by an insulating layer;
means for connecting the initializing element between the drain and the source of at least one of the transistors;
a pair of fuses;
means for connecting one of the fuses between the gate of the first transistor and the source of the first transistor;

means for connecting the second fuse between the gate of the second transistor and the source of the second transistor;

means for connecting a high positive voltage to the source of the first transistor;

means for connecting ground potential to the source of the second transistor;

output means connected to the drain of either transistor for providing an output signal; and the transistors, initializing element and fuses having parameters selected so that, when the fuses are conductive, the output means provides a first predetermined output signal and so that, when the fuses are nonconductive, the output means provides a second predetermined output signal.

13. The apparatus of claim 12 wherein the output means comprises means for generating a first predetermined signal having a signal level which bears a predetermined relationship to the supply voltage.

14. The apparatus of claim 12 wherein the output means comprises means for generating a first predetermined signal having a voltage level which is substantially equal to the supply voltage.

15. The apparatus of claim 12 wherein the first transistor is a p channel MOS transistor and the second transistor is a n channel MOS transistor.

16. The apparatus of claim 12 wherein the transistors comprise CMOS technology with the first transistor being p channel and the second transistor being n channel.

17. The apparatus of claim 12 wherein the initializing element is connected in parallel with the first transistor.

18. The apparatus of claim 12 wherein the initializing element is connected in parallel with the second transistor.

19. The apparatus of claim 12 wherein an initializing element is connected in parallel with both first and second transistors.

20. The apparatus of claim 12 wherein each fuse comprises a member of conductive polysilicon.

21. The apparatus of claim 12 wherein the initializing element comprises a capacitor.

* * * * *

UNITED STATES PATENT AND TRADEMARK OFFICE
CERTIFICATE OF CORRECTION

PATENT NO. : 4,837,520
DATED : June 6, 1989
INVENTOR(S) : Keith W. Golke, Robert L. Rabe It is certified that error appears in the above-identified patent and that said Letters Patent is hereby corrected as shown below:

Column 4, line 3, cancel "state" and substitute --status--.

Column 6, line 21, cancel "on" and substitute --one--.

Column 6, line 54, cancel "drawin" and substitute --drain--.

Signed and Sealed this

Thirty-first Day of July, 1990

Attest:

HARRY F. MANBECK, JR.

Attesting Officer

Commissioner of Patents and Trademarks